3,544,317
Patented Dec. 1, 1970

3,544,317

MIXTURES OF DIAZONIUM COMPOUNDS AND CARBOXYLATED POLYMERS IN THE MAKING OF A LIGHT-SENSITIVE LITHOGRAPHIC PLATE

Teruhiko Yonezawa, Kanagawa, Japan, assignor to Polychrome Corporation, Yonkers, N.Y.

No Drawing. Filed Dec. 15, 1966, Ser. No. 601,848
Claims priority, application Japan, Dec. 18, 1965, 40/77,966
Int. Cl. G03f *7/02;* G03c *1/52*
U.S. Cl. 96—33 10 Claims

ABSTRACT OF THE DISCLOSURE

A light-sensitive composition which comprises a mixture of a polymeric material having a molecular weight of between about 10,000 and 100,000 and having carboxyl groups thereon, said polymeric material being substantially insoluble in a solution of equal parts of water and isopropyl alcohol and being slightly swelled by said solution without substantial decrease of its film strength, and a light-sensitive diazonium compound; and positive-acting lithographic printing plates having said light-sensitve composition coated on a supporting base.

The present invention relates to a printing plate endowed with light sensitivity for making a positive printing plate by light exposure through a transparent or translucent positive original or pattern.

A diazonium compound, for example, a diazonium salt of p-amino-diphenylamine or a formaldehyde-condensate thereof, which has hitherto been known as a light-sensitive material for lithographic printing plates, is converted when struck by light into an ink-receptive compound while the unexposed diazonium compound is easily dissolved with water or an aqueous solution of an acid or gum arabic. Therefore, a hydrophilic surface thereof can be used for making a positive printing plate by exposure through a negative original or pattern. A printing plate having such a property is generally called a "negative-acting plate." On the other hand, there are light-sensitive compounds which have an ink-receptive property that can be converted into a hydrophilic compound when struck by light. A hydrophilic plate having a coating of such a light-sensitive compound on the hydrophilic surface can be used for making a positive printing plate by exposure through a positive original or pattern. A printing plate having such a property is generally called a "positive-acting plate."

As light-sensitive materials for providing positive-acting printing plates there are ortho-diazoquinones described in U.S. Pat. No. 2,772,972, the reaction product of potassium ferrocyanide and a diazo compound described in U.S. Pat. No. 3,113,023, and the reaction compound of the poly-complex oxygenated anion of a heteropoly-acid or an isopoly-acid described in Japanese Pat. No. 7,663/64.

It has now been found that a mixture of a polymer having carboxyl groups and diazonium is very effective as a light-sensitive material capable of making positive-acting printing plates. That is, the present invention is concerned with positive-acting printing plates containing such a mixture in the light-sensitive layer thereon.

Polymers having carboxyl groups to be used in the present invention can be addition polymerization type polymers obtained by the copolymerization of an unsaturated ethylene compound having a carboxyl group or groups at the $\alpha$-position or the $\alpha,\beta$-positions of the compound, for example, acrylic acid, methacrylic acid, acroylhydroacrylic acid, maleic anhydride, itaconic acid, crotonic acid and vinyl benzoate, with one or more other unsaturated ethylene compounds, or can be condensation polymerization type polymers shown in the following formulas;

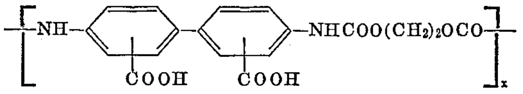
(I)

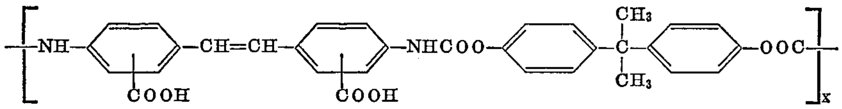
(II)

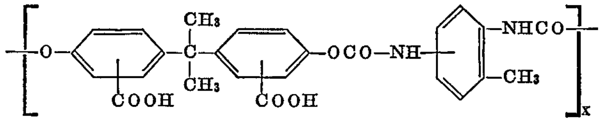
(III)

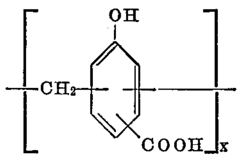
(IV)

or can be a high-molecular weight compound such as carboxyl methyl cellulose in which a carboxyl group has been introduced by chemical reaction. That is, the polymers include naturally occurring or synthetic high-molecular weight compounds having carboxyl groups. Further, the carboxyl group of such a high-molecular weight compound may be the sodium, potassium or ammonium salt thereof.

The most important property of such a polymer that determines whether it can practically be used on a positive-acting printing plate is its water solubility. That is, a polymer that contains enough carboxyl groups so that when it is mixed with a diazonium salt the mixture is easily dissolved in water cannot practically be used, while a polymer showing little or no hydrophilic property also cannot be used. A practically adoptable measure of the number of carboxyl groups in the polymers cannot be generally defined because the number is influenced by the hydrophilic property of portions of the polymer other than the carboxyl groups. The polymer, however, must contain a sufficient number of carboxyl groups to satisfy the following conditions, that is:

(1) The polymer is slightly swelled by a solution containing 1 part of water and 1 part of isopropyl alcohol but does not lose its strength as a film or a coating, and (2) The polymer is not dissolved by that solution.

The molecular weight of the polymer can vary over a considerably wide range and influences the kind of solvent for the polymer, the solubility of the polymer in the solvent and the viscosity of the solution of the polymer. The molecular weight also largely influences the speed of development of a light-sensitive printing plate containing the polymer, the adhesive strength of the image to the support, the sharpness of image and the length of the presslife of the printing plate. The optimum molecular weight varies according to the type of polymer, and is preferably from about 10,000 to about 100,000.

Diazonium compounds having many structures can be employed in the present invention, but a condensation product of formaldehyde and a diazo compound of p-aminodiphenylamine, preferably one that has been stabilized with zinc chloride, is especially suitable. To improve the solubility of that condensation product in organc solvents, it can be further reacted with p-toluene sulfonic acid, ammonium fluoroborate or ammonium hexafluorophosphate.

The mixing ratio of the carboxyl-containing polymer to the diazonium salt can be within the range of about 50:1 to about 5:1. The mixture is dissolved in a suitable aqueous or organic solvent, for example, methyl ethyl ketone, Cellosolve, dimethyl formamide, dimethyl sulfoxide, dioxane, cyclohexane, water or a mixture thereof and the solution is applied to a supporting base such as a metallic plate that has previously been treated by processes as described in, for example, Japanese Pat. No. 22,063/61, U.S. Pat. No. 2,995,443, British Pat. No. 907,002, U.S. Pat. No. 3,130,051, U.S. Pat. No. 3,163,534, Japanese Pat. No. 706/59 and Japanese Pat. No. 23,982/64. The supporting base can be paper or plastic; a suitable metallic plate can be of aluminum, zinc, tin, copper and the like. Into the coating solution can be incorporated a surface-active agent, a pigment, a dye or fillers such as colloidal silica, clay or white carbon. The addition of a surface-active agent improves the wettability of the coating solution on the metallic plate or paper, the addition of pigment or dye makes the developed image easily perceivable, and the addition of fillers influences the removability of the coating at development and the physical strength of the image.

The amount of the coating is suitably about 0.01 to 2 g./sq. m., after drying, and the coated plate or sheet can be dried by hot air or by infrared irradiation by means such that the surface temperature remains at less than about 100° C. A positive-acting lithographic printing plate is thus obtained.

In general when a film composed of a mixture of a naturally occurring or a synthetic high-molecular weight material and a diazonium salt is struck by light, the film becomes insoluble in a solvent because free radicals formed during the photo-chemical decomposition of the diazonium salt cause reaction among the molecules in the high molecular weight chains to provide a three-dimensional structure, i.e., crosslinking. Therefore, in such a conventional case, the unexposed portions can be removed with a solvent, leaving only the exposed portions.

On the otherhand, in the coatings formed by mixtures of carboxylic acid polymers and diazonium salts according to the present invention, the exposed portions can be removed from the lithographic printing plate by a solvent for the polymers diluted with a non-solvent. The mechanism is not yet clear but it presently is considered that the high-molecular weight chains are broken by light irradiation and, as a result of the formation of three-dimensional structures, the adhesion of the coating will be substantially reduced in the mixed system of solvent and non-solvent.

A positive-acting lithographic printing plate according to this invention can be used as follows:

(1) Exposure: A lithographic printing plate of this invention was placed together with a positive film and was exposed for 2 minutes by means of a 30 amp. carbon arc at a distance of 70 cm. from the light source. Suitable exposure was obtained by using a gray scale of LTF of 21st step until the film of 4th step was completely removed.

(2) Development: The exposed surface of the printing plate was rubbed lightly with an absorbent cotton wad or a velvety brush impregnated with a developing solution having the following composition to remove the exposed portions of the light-sensitive film:

| | Parts |
|---|---|
| Water | 2 |
| Ethyl acetate | 1 |
| Isopropyl alcohol | 1 |
| Diacetone alcohol | 0.5 |

(3) Application of developing ink: A standard lithographic developing ink, Developing Ink No. 801 (made by Fuji Photo-Film Co. of Japan, was applied to the developed printing plate surface by means of a cellulose sponge.

(4) Gum coating: A dilute aqueous solution of gum arabic was applied to the surface of the developed plate and dried.

Printing plates processed as described reproduce 50,000 to 100,000 copies on standard lithographic printing machines. During press runs no contamination of the plates was observed and the sharpness of the images was very good.

Another feature of the present invention is that the storage life of lithographic printing plates according to this invention is long. In general diazonium salts are unstable to water. The diazonium salts used in this invention, however, are protected by the resin and hence are prevented from being contacted directly with moisture in the air, and the printing plates of this invention can be preserved stably for at least about one year. Furthermore, as mentioned above, the printing plates of this invention can be used easily without the necessity of special skills and, because the image is composed of a resin, it is unnecessary to strengthen the image by applying a lacquer to it.

The principle of the present invention can, of course, be applied not only to lithographic printing but also to relief printing, intaglio printing and other methods of printing.

EXAMPLE 1

| A mixture of: | Parts |
|---|---|
| Copolymer of vinyl chloride (84%), vinyl acetate (13%) and maleic anhydride (3%) | 10 |
| Reaction product of the formaldehyde condensate of p- diazodiphenylamine and p-toluene sulfonic acid | 1 |
| Methanol | 25 |
| Cellosolve acetate | 85 |
| Pigment red 17 (made by Sumitomo Chemical Co. | 2 |

was passed through a colloid mill to prepare a uniform solution which was applied to an aluminum plate, the surface of which had been processed by the method described in U.S. Pat. 2,946,683, and dried. The quantity coated was 0.8 g./sq. m. After drying sufficiently, a positive image was printed on the plate by exposure through a positive film. The printing plate was then developed by removal of the exposed portions of the coating, a developing ink was applied and the plate was coated with gum arabic. The plate thus obtained was run on a Heidelberg offset printing press, and it produced 100,000 copies.

EXAMPLE 2

A mixture of:

| | Parts |
|---|---|
| Copolymer of vinyl acetate (85%), ethyl acrylate (11%) and crotonic acid (4%) | 8 |
| Formaldehyde condensate of p-diazodiphenylamine and ammonium fluborate | 1 |
| Cellosolve acetate | 80 |
| Methyl ethyl ketone | 15 |
| Diacetone alcohol | 15 |
| Cyania blue | 2 |

was mixed in a ball mill for about 10 hours. The resulting solution was applied to an aluminum plate, which had been subjected to a surface treatment by the method described in U.S. Pat. No. 2,946,683, and then dried by an infrared heater. The amount coated was 2 g./sq. m. The lithographic printing plate thus prepared provided very good results.

I claim:

1. A light-sensitive composition which comprises a mixture of polymeric material having a molecular weight of between about 10,000 and 100,000 and having carboxyl groups thereon, said polymeric material being substantially insoluble in a solution of equal parts of water and isopropyl alcohol and being slightly swelled by said solution without substantial decrease of its film strength, and said polymeric material being (1) an addition polymer obtained by copolymerization of an ethylenically unsaturated compound having at least one carboxyl group at the alpha- or alpha,beta- positions with another ethylenically unsaturated compound, (2) a condensation polymer of the formula

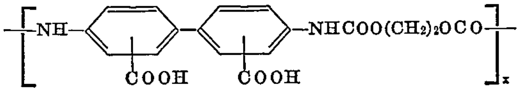
(I)

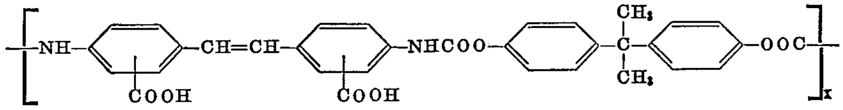
(II)

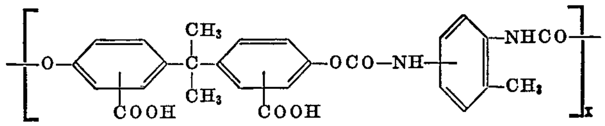
(III)

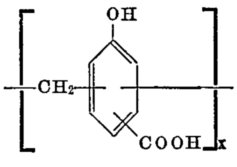
(IV)

or (3) a carboxyl alxyl cellulose, and a light-sensitive diazonium compound.

2. A light-sensitive composition according to claim 1 wherein said diazonium compound is selected from the group consisting of a condensation product of p-diazodiphenylamine and formaldehyde, p-diazodiphenylamine and formaldehyde stabilized with zinc chloride, and p-diazodiphenylamine and formaldehyde reacted with p-toluene sulfonic acid, ammonium fluoroborate or ammonium hexafluorophosphate.

3. A light-sensitive composition according to claim 1 wherein said diazonium compound is a condensation product of formaldehyde and a diazo compound of p-aminodiphenylamine.

4. A light-sensitive composition according to claim 1 wherein said composition contains from about 5 to about 50 parts by weight of said polymeric material per part of said diazonium compound.

5. A light-sensitive positive-acting lithographic printing plate which comprises a supporting base and coated thereon a light-sensitive composition which comprises a mixture of a polymeric material having a molecular weight of between about 10,000 and 100,000 and having carboxyl groups thereon, said polymeric material being substantially insoluble in a solution of equal parts of water and isopropyl alcohol and being slightly swelled by said solution without substantial decrease of its film strength, and said polymeric material being (1) an addition polymer obtained by copolymerization of an ethylenically unsaturated compound having at least one carboxyl group at the alpha- or alpha, beta- positions with another ethylenically unsaturated compound, (2) a condensation polymer of the formula

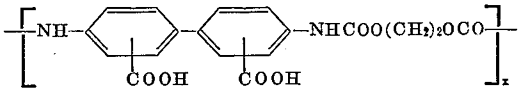
(I)

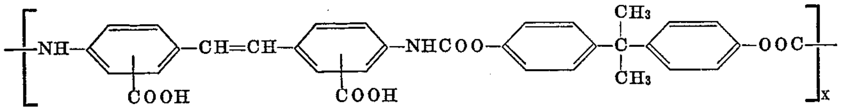
(II)

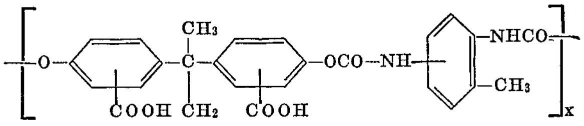
(III)

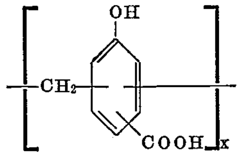
(IV)

or (3) a carboxy alkyl cellulose, and a light-sensitive diazonium compound.

6. A light-sensitive positive-acting lithographic printing plate acording to claim 5 wherein said diazonium compound is selected from the group consisting of a condensation product of p-diazodiphenylamine and formaldehyde, p-diazodiphenylamine and formaldehyde stabilized with zinc chloride, and p-diazodiphenylamine and formaldehyde reacted with p-toluene sulfonic acid, ammonium fluoroborate or ammonium hexafluorophosphate.

7. A light-sensitive positive-acting lithographic printing plate according to claim 5 wherein said diazonium compound is a condensation product of formaldehyde and a diazo compound of p-amino-diphenylamine.

8. A light-sensitive positive-acting lithographic printing plate according to claim 5 wherein said composition contains from about 5 to about 50 parts by weight of said polymeric material per part of said diazonium compound.

9. A light-sensitive composition according to claim 1 wherein said ethylenically unsaturated compound (1) is acrylic acid, methacrylic acid, acroylhydroacrylic acid, maleic anhydride, itaconic acid, crotonic acid or vinyl benzoate.

10. A light-sensitive posiitve-acting lithographic printing plate according to claim 5 wherein said ethylenically unsaturated compound (1) is acrylic acid, methacrylic acid, acroylhydroacrylic acid, maleic anhydride, itaconic acid, crotonic acid or vinyl benzoate.

References Cited

UNITED STATES PATENTS

| | | | |
|---|---|---|---|
| 3,383,211 | 5/1968 | Poels et al. | 96—29 |
| 3,235,382 | 2/1966 | Neugebauer | 96—33 |
| 3,211,553 | 10/1965 | Ito | 96—75 |
| 3,166,421 | 1/1965 | Gramlich | 96—49 |

DONALD LEVY, Primary Examiner

M. B. WITTENBERG, Assistant Examiner

U.S. Cl. X.R.

96—91

UNITED STATES PATENT OFFICE
CERTIFICATE OF CORRECTION

Patent No. 3,544,317 Dated December 1, 1970

Inventor(s) Teruhiro Yonezawa

It is certified that error appears in the above-identified patent and that said Letters Patent are hereby corrected as shown below:

Col. 3, line 24, change "organc" to -- organic --;

Claim 5, formula (III), change "$CH_2$" to -- $CH_3$ -- thus $$\begin{array}{c} CH_3 \\ | \\ -\,C\,- \\ | \\ CH_3 \end{array}$$

SIGNED AND SEALED
MAR 2 1971

(SEAL)
Attest:

Edward M. Fletcher, Jr.
Attesting Officer

WILLIAM E. SCHUYLER, JR.
Commissioner of Patents